(12) United States Patent
Xi et al.

(10) Patent No.: US 11,456,726 B1
(45) Date of Patent: Sep. 27, 2022

(54) GATE DRIVER CIRCUIT AND MULTIPHASE INTELLIGENT POWER MODULE

(71) Applicant: Shenzhen Xhorse Electronics Co., Ltd., Guangdong (CN)

(72) Inventors: Yongfeng Xi, Guangdong (CN); Chenglong Li, Guangdong (CN); Yuan He, Guangdong (CN); Yijie Hao, Guangdong (CN); Guozhong Cao, Guangdong (CN); Xubin Zhao, Guangdong (CN)

(73) Assignee: Shenzhen Xhorse Electronics Co., Ltd., Shenzhen (CN)

( * ) Notice: Subject to any disclaimer, the term of this patent is extended or adjusted under 35 U.S.C. 154(b) by 0 days.

(21) Appl. No.: 17/484,198

(22) Filed: Sep. 24, 2021

(30) Foreign Application Priority Data

Aug. 30, 2021 (CN) .......................... 202111003963.3

(51) Int. Cl.
| | |
|---|---|
| H03K 3/00 | (2006.01) |
| H03K 17/16 | (2006.01) |
| H03K 17/687 | (2006.01) |
| H02M 1/08 | (2006.01) |
| H02M 3/07 | (2006.01) |
| H03K 3/012 | (2006.01) |
| H03K 17/567 | (2006.01) |

(52) U.S. Cl.
CPC .......... *H03K 3/012* (2013.01); *H03K 17/567* (2013.01); *H03K 17/687* (2013.01)

(58) Field of Classification Search
None
See application file for complete search history.

(56) References Cited

U.S. PATENT DOCUMENTS

2020/0350814 A1* 11/2020 Nakakohara ............ H02M 3/07

* cited by examiner

*Primary Examiner* — Kenneth B Wells (57) ABSTRACT

The application provides a gate driver circuit and a multiphase intelligent power module. When a first switch unit is closed, a power supply charges a first capacitor and a second capacitor, and a first buffer provides a gate voltage for a first power transistor. The first capacitor can improve the potential of the gate of the first power transistor, so that the first power transistor is turned on; second capacitor can provide a negative turn-off voltage for the first power transistor, and can adaptively convert external voltage into voltage that can drive the power transistor. Moreover, the circuit can be realized easily and the voltage of the first power transistor is stable.

11 Claims, 4 Drawing Sheets

Fig. 4 ly value. In addition, if the output voltage of the power supply is large, it may lead to overcharge of the passive devices, which may affect the reliability of power transistors. Although such overcharge problem may be alleviated by inductance in the traditional way, it limits the maximum on-time of power transistors. In the traditional gate driver circuit, the negative turn-off voltage may be provided for the power transistor by configuring a plurality of passive devices such as diodes and inductors, but this negative turn-off voltage is uncontrollable.

GATE DRIVER CIRCUIT AND MULTIPHASE INTELLIGENT POWER MODULE

CROSS REFERENCE TO RELATED APPLICATIONS

The present application claims the benefit of Chinese Patent Application No. 202111003963.3 filed on Aug. 30, 2021, the contents of which are incorporated herein by reference in their entirety.

TECHNICAL FIELD

The application relates to the technical field of gate drive, in particular to a gate driver circuit and a multiphase intelligent power module.

BACKGROUND

A gate driver circuit is used for driving various field-effect transistors to turn on and off. A conventional gate driver circuit includes a bootstrap circuit, and the bootstrap circuit is provided with several passive devices. In a dead-time when one power semiconductor is turned off and the other power semiconductor is not yet turned on, the switch node voltage may become a comparatively large negative value. In addition, if the output voltage of the power supply is large, it may lead to overcharge of the passive devices, which may affect the reliability of power transistors. Although such overcharge problem may be alleviated by inductance in the traditional way, it limits the maximum on-time of power transistors. In the traditional gate driver circuit, the negative turn-off voltage may be provided for the power transistor by configuring a plurality of passive devices such as diodes and inductors, but this negative turn-off voltage is uncontrollable.

SUMMARY

For the above reasons, in order to solve the problem that negative turn-off voltage is uncontrollable, it is necessary to provide a gate driver circuit and a multiphase intelligent power module, which can adaptively convert the external voltage into a voltage that can drive field-effect transistor, and the circuit is easy to realize.

A gate driver circuit, including a first switch unit, a first drive unit and a second drive unit;

the first switch unit is connected in series with a first capacitor and a second capacitor; and when the first switch unit is closed, the power supply is used for charging the first capacitor and the second capacitor;

the first drive unit includes a first buffer, a first power transistor, a first capacitor and a second capacity; and an output end of the first buffer is connected with the gate of the first power transistor;

the first capacitor is configured to increase the gate voltage of the first power transistor when the first buffer drives the first power transistor to an on state, so that the first power transistor is turned on;

the second capacitor is configured to provide a negative turn-off voltage for the first power transistor when the first buffer drives the first power transistor to an off state, so that the first power transistor is turned off; and the second drive unit includes a second buffer and a second power transistor; and an output end of the second buffer is connected with the gate of the second power transistor; and a high-voltage end of the second buffer is connected with the positive electrode of the power supply; the source of the second power transistor is connected with a ground; the source of the first power transistor is connected with the drain of the second power transistor.

A multiphase intelligent power module, including a power supply, a first switch unit, at least two first drive units, and a second drive unit corresponding to each first drive unit;

the first switch unit is connected in series with a first capacitor and a second capacitor; and when the first switch unit is closed, the power supply is used for charging the first capacitor and the second capacitor;

the first drive unit includes a first buffer, a first power transistor, a first capacitor and a second capacity; and an output end of the first buffer is connected with the gate of the first power transistor;

the first capacitor is configured to increase the gate voltage of the first power transistor when the first buffer drives the first power transistor to an on state, so that the first power transistor is turned on;

the second capacitor is configured to provide a negative turn-off voltage for the first power transistor when the first buffer drives the first power transistor to an off state, so that the first power transistor is turned off; and the second drive unit includes a second buffer and a second power transistor; and an output end of the second buffer is connected with the gate of the second power transistor; and a high-voltage end of the second buffer is connected with the positive electrode of the power supply; the source of the second power transistor is connected with a ground; the source of the first power transistor is connected with the drain of the second power transistor.

With the above-described gate driver circuit and multiphase intelligent power module, when a first switch unit is closed, a power supply charges a first capacitor and a second capacitor, and a first buffer provides a gate voltage for a first power transistor. The first capacitor can improve the potential of the gate of the first power transistor, so that the first power transistor is turned on; second capacitor can provide a negative turn-off voltage for the first power transistor, and can adaptively convert external voltage into voltage that can drive the power transistor. Moreover, the circuit can be realized easily and the voltage of the first power transistor is stable.

DETAILED DESCRIPTION OF DISCLOSED EMBODIMENTS

It should be understood that the specific embodiments described herein are only used to explain the present application, not intended to limit the present application.

The technical solution in the embodiments of the present application will be clearly and completely described in the followings, with reference to the drawings. It is apparent that the described embodiments are some but not all of the embodiments of the present application. All other embodiments obtained by a person of ordinary skill in the art without any creative effort on the basis of the embodiments in the present application shall fall into the scope of the present application.

It should be noted that all directional indicators (such as up, down, left, right, front, back, . . . ) in the embodiment of the present application are only used to explain the relative position relationships and movements among components in a certain way (as shown in the drawings). When the position of the object is changed, the relative position relationship may be changed accordingly. The connection may be direct or indirect.

In addition, in the present application, descriptions such as "first", "second", etc. are used for descriptive purposes only, and should not be understood as indicating or implying their relative importance or implicitly indicating the number of the described technical features. These terms are only used to distinguish one element from the other. Particularly, without departing from the scope of this application, the first power transistor may be referred to as a second power transistor, and similarly, the second power transistor may be referred to as a first power transistor. The first power transistor and the second power transistor are both power transistors, but they are not the same power transistor. Further, unless otherwise required by context, singular terms shall include pluralities and plural terms shall include the singular. Thus, as used herein and in the claims, the singular forms include the plural reference and vice versa unless the context clearly indicates otherwise.

It can be understood that the term "connection" in the following embodiments should be understood as "electrical connection" and "communication connection" if the connected circuits, modules, units, devices, etc. have transmission of electrical signals or data with each other.

In addition, the technical solutions of the embodiments can be combined with each other, but they must be based on the implementation by those skilled in the art. When the combination of technical solutions is contradictory or impossible to be implemented, it should be considered that the combination of these technical solutions does not exist, nor is it within the protection scope of the present application.

Figure 1:
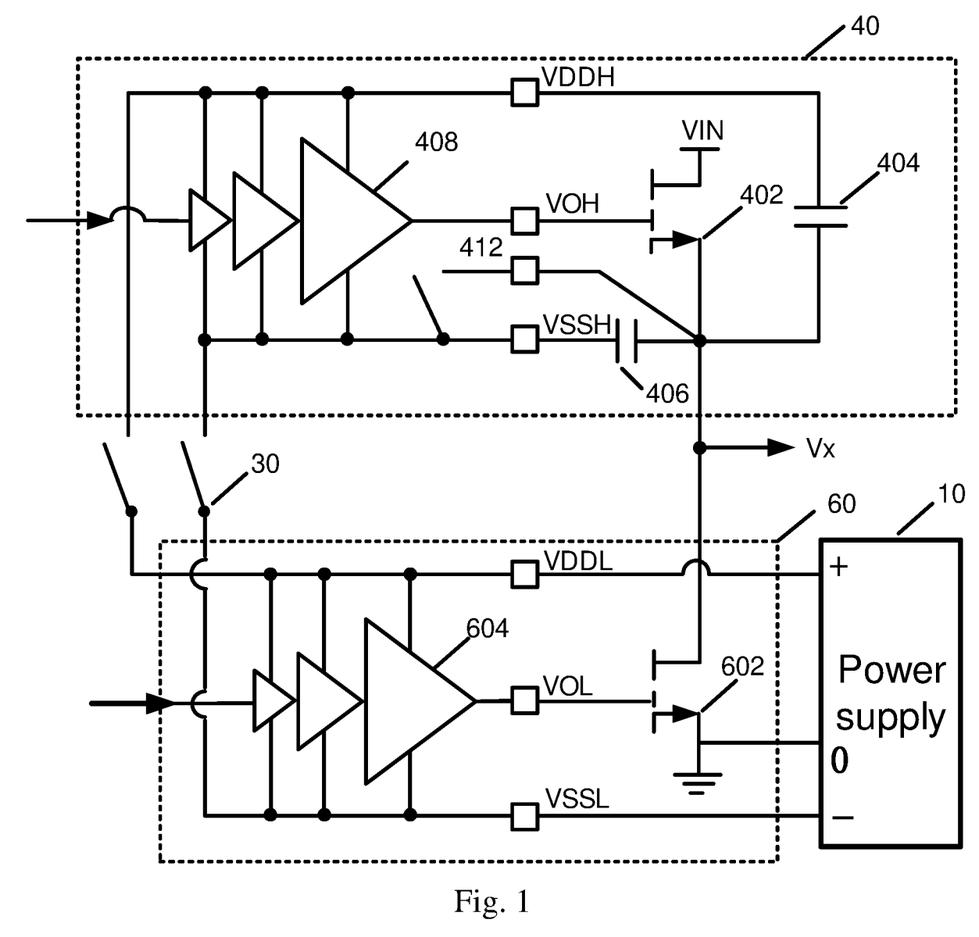
FIG. 1 is a schematic diagram of a gate driver circuit according to an embodiment.

As shown in FIG. 1, a schematic diagram of a gate driver circuit according to an embodiment. The gate driver circuit includes a power supply 10, a first switch unit 30, a first drive unit 40 and a second drive unit 60. The first drive unit 40 includes a first power transistor 402, a first capacitor 404, a second capacitor 406 and a first buffer 408. The power supply 10, the first switch unit 30, the first capacitor 404 and the second capacitor 406 are connected in series to form a closed loop circuit. When the first switch unit 30 is closed, the power supply 10 is used to charge the first capacitor 404 and the second capacitor 406. Then first capacitor 404 and second capacitor 406 have a positive electrode and negative electrode after being charged. The first buffer 408 is composed of a plurality of inverters, which can increase the input voltage. The high-voltage end of the first buffer 408 is connected to the positive electrode of the first capacitor 404, and the low-voltage end of the first buffer 408 is connected to the negative electrode of the second capacitor 406. An output end of the first buffer 408 is connected to the gate of the first power transistor 402.

The first power transistor 402 can be either a silicon power FET (field-effect transistor) or a wide-bandgap FET. The first switch unit 30 may include one switch or two switches, etc. The first switch unit may be realized by off-chip high voltage transistors, such as FQN1N60C N-MOS transistors, or may be integrated on a chip. Similarly, the second switch unit is implemented in the same way as the first switch unit. The power supply 10 may be an Auxiliary Supply Generator.

After being charged, the first capacitor 404 is used to increase the gate voltage of the first power transistor 402 when the first buffer 408 drives the first power transistor 402 to an on state, so that the first power transistor 402 is turned on. That is, when the output end of the first buffer 408 and the high-voltage end of the first buffer 408 are on, the charged first capacitor 404 increases the gate voltage of the first power transistor 402 on the basis of the gate voltage provided by the first buffer 408, so that the first power transistor 402 is turned on.

After being charged, the second capacitor 406 is used to provide a negative turn-off voltage for the first power transistor 402 when the first buffer 408 drives the first power transistor 402 to an off state, so that the first power transistor 402 is turned off. That is, when the output end of the first buffer 408 and the low-voltage end of the second buffer 604 are on, the second capacitor 406 is used to provide a negative turn-off voltage for the first power transistor 402, so that the first power transistor 402 is turned off.

The second drive unit 60 includes a second power transistor 602 and a second buffer 604. The output end of the second buffer 604 is connected to the gate of the second power transistor 602. The high-voltage end of the second buffer 604 is connected to the positive electrode of the power supply 10, and the source of the second power transistor 602 is connected to a ground. Then the second buffer 604 can control on/off of the second power transistor 602. The first power transistor 402 and second power transistor 602 are alternately turned on when the source of the first power transistor 402 is connected to the drain of the second power transistor 602. Therefore, the potential between the first power transistor 402 and the second power transistor 602 changes accordingly, and alternate current of high potential is generated.

In this embodiment, when the switch is closed, the power supply 10 charges the first capacitor 404 and the second capacitor 406. The first buffer 408 provides a gate voltage for the first power transistor 402, and the first capacitor 404 can increase the potential of the gate of the first power transistor 402, so that the first power transistor 402 is turned on. The second capacitor 406 can provide a negative turn-off voltage for the first power transistor 402, which can adaptively convert external voltage into voltage capable of driving power transistor, and the circuit is easy to realize, the voltage of the first power transistor 402 is stable.

In an embodiment, the negative electrode of the power supply 10 is used to connect with the low-voltage end of the second buffer 604; when the second buffer 604 drives the second power transistor 602 to an off state, the negative electrode of the power supply 10 is used to provide a negative turn-off voltage for the second power transistor 602.

The negative electrode of power supply 10 outputs a negative voltage. The second power transistor 602 may be a wide-bandgap FET. The wide-bandgap FET may be made of wide-bandgap semiconductor materials such as GaN or SiC.

Specifically, the power supply 10 may include three ports, which are a positive electrode, a ground electrode and a negative electrode. The voltage of positive electrode may be 15V, 5V, etc. The ground voltage is 0 V. The negative voltage may be specifically the negative turn-off voltage of the second power transistor 602. For example, the turn-off voltage of GaN transistor may be-3V, etc. The output end of the controller 50 is connected to the gate of the second power transistor 602 via the second buffer 604, and the gate of the second power transistor 602 is further connected to the negative electrode of the power supply 10. The electrical signal output by the controller 50 is amplified by the second buffer 604 and input to the gate of the second power transistor 602, and the current flows from the gate to the source of the second power transistor 602, so that the second power transistor 602 is turned on. While when the output end of the controller 50 does not output an electrical signal, the source of the second power transistor 602 is connected to the negative electrode of the power supply 10, so the potential of the source of the second power transistor 602 is higher than the potential of the gate, thereby the current flows from the source to the gate, and the second power transistor 602 is turned off.

In this embodiment, the negative electrode of the power supply 10 is used to connect with the low-voltage end of the second buffer 604. When the second buffer 604 drives the second power transistor 602 to an off state, the negative electrode of the power supply 10 is used to provide a negative turn-off voltage for the second power transistor 602, which can adaptively convert the external voltage into a voltage capable of driving the power transistor, thereby the second power transistor 602 is adaptively turned off, and the circuit is easy to realize.

In an embodiment, the circuit further includes a controller 50 for controlling on/off of the first switch unit 30, so as to control the charging time of the first capacitor 404 and the second capacitor 406. The controller 50 is further used to alternately output control signals to the first buffer 408 and the second buffer 604, so that the first buffer 408 provides a gate voltage for the first power transistor 402, and the second buffer 604 provides a gate voltage for the second power transistor 602. A control signal output by the controller 50 is capable of changing the potential between the first power transistor 402 and the second power transistor 602 to generate alternate current.

In an embodiment, the circuit also includes a level shifter 410. The level shifter 410 has its input end connected to the controller 50, and its output end connected to the input end of the first buffer 408. In this embodiment, the level shifter 410 can be used to increase the input voltage of the first buffer 408 to realize the gate driver function.

In an embodiment, the first power transistor 402 includes a wide-bandgap FET (Field Effect Transistor), an IGBT (Insulated Gate Bipolar Transistor) or a MOSFET (Metal Oxide Seminconductor Field Effect Transistor). The wide-bandgap FET may be SiC FET or GaN FET.

In an embodiment, the second power transistor 602 may also include a wide-bandgap FET (Field Effect Transistor), an IGBT (Insulated Gate Bipolar Transistor) or a MOSFET (Metal Oxide Seminconductor Field Effect Transistor). The wide-bandgap FET may be SiC FET or GaN FET.

In an embodiment, the gate driver circuit further includes a second switch unit 412, which is used to short-circuit the gate of the first power transistor 402 and the source of the first power transistor 402, the first power transistor 402 is turned off.

The second switch unit 412 may be implemented by different devices such as power transistors or diodes that can realize the switching function.

Specifically, one end of the second switch unit 412 is connected to the gate of the first power transistor 402, and the other end is connected to the source of the first power transistor 402. The second switch unit 412 is used to short-circuit VOH (i.e., the gate of first power transistor 402) with the source of first power transistor 402 when it is necessary to turn off the first power transistor 402 for a long time, the first power transistor 402 is turned off. The second switch unit may be used to protect the first power transistor 402.

In an embodiment, the controller 50, level shifter 410, first buffer 408 and second buffer 604 are integrated in a chip. The high-voltage, output and low-voltage ends of the first buffer 408 and the high-voltage, output and low-voltage ends of the second buffer 604 are used as peripheral interfaces of the chip. In this embodiment, the controller 50, level shifter 410, first buffer 408, and second buffer 604 are integrated into a chip, so that the gate driver circuit can be monolithically integrated and the circuit size is reduced.

Figure 2:
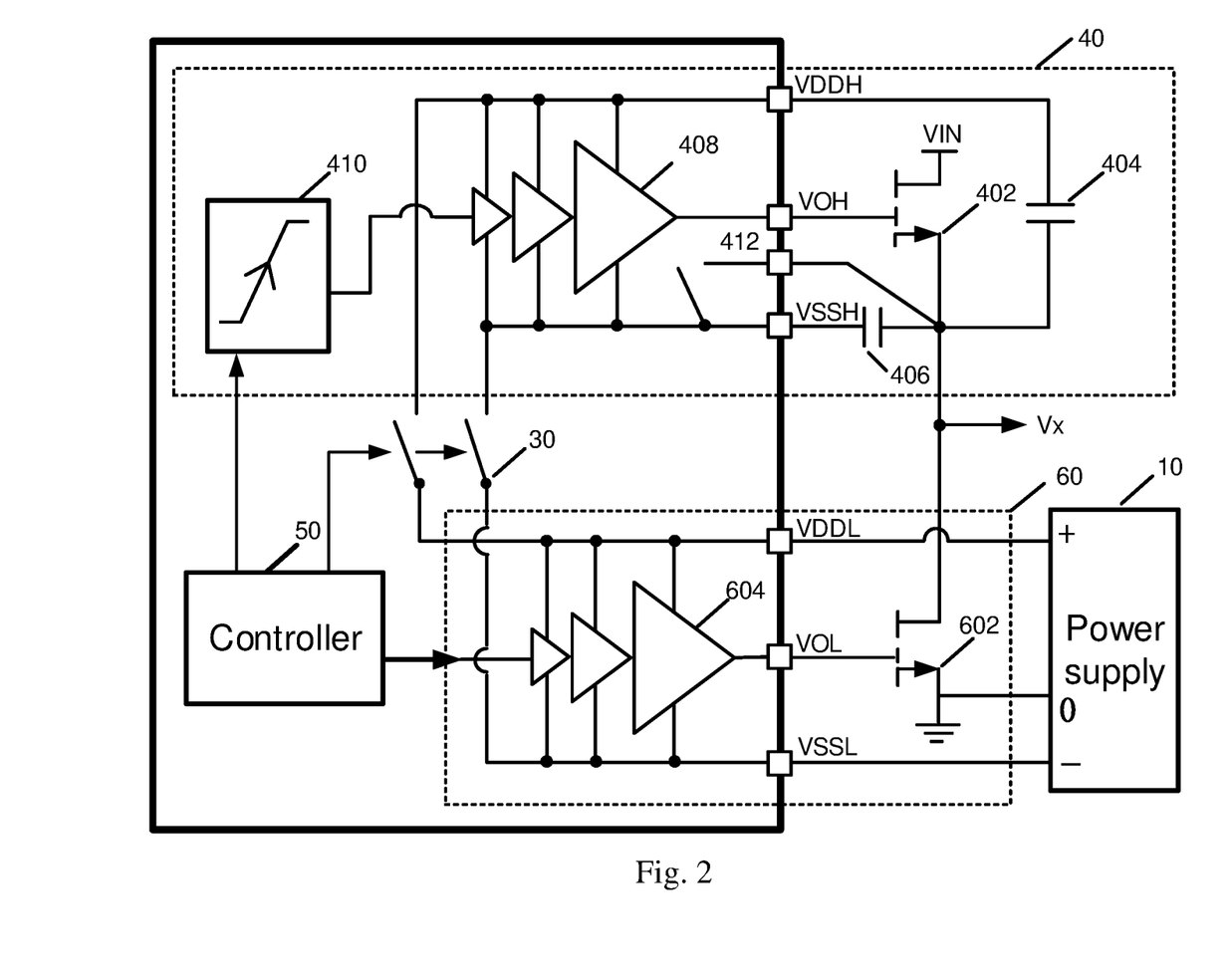
FIG. 2 is a schematic diagram of a gate driver circuit with a wide-bandgap semiconductor according to an embodiment.

In an embodiment, as shown in FIG. 2, a schematic diagram of a gate driver circuit with a wide-bandgap semiconductor according to an embodiment; The diagram includes a power supply 10, controller 50, level shifter 410, first switch unit 30, first drive unit 40 and second drive unit 60. The first drive unit 40 includes a first buffer 408, a first power transistor 402, a first capacitor 404 and a second capacitor 406. The second drive unit 60 includes a second buffer 604 and a second power transistor 602. The controller 50, level shifter 410, first buffer 508 and second buffer 604 may be monolithically integrated.

The output end of the controller 50 is connected to the input end of the level shifter 410. The output end of the controller 50 is further used to control on/off of the first switch unit 30. The output end of the level shifter 410 is directly connected to the input end of the first buffer 408, and the output end of the first buffer 408 is connected to gate of the first power transistor 402. The first buffer 408 also includes a high-voltage end VDDH and a low-voltage end VSSH. The first capacitor 404 is connected to the first buffer 408 via the high-voltage end VDDH of the first buffer 408, thereby being connected to the gate of the first power transistor 402. The negative electrode of the first capacitor 404 is directly connected with the source of the first power transistor 402. The drain of the first power transistor 402 is connected to VIN. The source of the first power transistor 402 is connected to a drain of the second power transistor 602. The source of the first power transistor 402 is further connected to the positive electrode of the second capacitor 406. The gate of the first power transistor 402 is connected to the negative electrode of the second capacitor 406.

The controller 50 is connected to the input end of the second buffer 604, the output end of the second buffer 604 is connected to the gate of the second power transistor 602, and the source of the second power transistor 602 is grounded. The negative electrode of the power supply 10 is connected to the low-voltage end VSSL of the second buffer 604, and connected to the gate of the second power transistor 602 via the output end VOL of the second buffer 604. One end of the second switch unit 412 is connected to the gate of the first power transistor 402, and the other end is connected to the source of the first power transistor 402.

The circuit implementation principle is described as follows:

The power supply 10 is connected in series with the first capacitor 404 and second capacitor 406 via the first switch unit 30. When the first capacitor 404 and second capacitor 406 are fully charged, the controller 50 controls the first switch unit 30 to turn off.

The controller 50 transmits the electrical signal to the level shifter 410, and the level shifter 410 inputs the output electrical signal to the first buffer 408. The first buffer 408 amplifies the electrical signal and inputs it to the gate of the first power transistor 402. The first capacitor 404 is connected to the gate of the first power transistor 402, and is used to increase the gate voltage of the first power transistor 402. At this point, the VDDH potential of the first buffer 408 is consistent with the VOH potential. A current flows from the gate of the first power transistor 402 to the source of the first power transistor 402, and the first power transistor 402 is turned on. The second power transistor 602 is not turned on at this time.

The controller 50 stops inputting electrical signal to the gate of the first power transistor 402 and inputs electrical signal to the gate of the second power transistor 602 via the second buffer 604. At this point, the positive electrode of the second capacitor 406 outputs an electrical signal to the source of the first power transistor 402, providing a negative turn-off voltage for the first power transistor 402, and forming a circuit loop with the negative electrode of the second capacitor 406 via the gate of the first power transistor 402, the first power transistor 402 is turned off.

The controller 50 transmits electrical signal to the gate of the second power transistor 602, so that the second power transistor 602 is turned on, and the potentials of VDDL and VOL are the same. When the controller 50 stops transmitting electrical signal to the gate of the second power transistor 602, the potentials of VOH and VSSL are the same at this time, and current flows from the source to the gate of the second power transistor 602, so that the second power transistor 602 is turned off. Therefore, the potential at Vx changes to form an alternate current. In case that the first power transistor 402 needs to be turned off for a long time, the VOH (i.e., the gate of the first power transistor 402) is short-circuited with the source of the first power transistor 402, the first power transistor 402 is turned off.

The gate driver circuit in this embodiment can realize a controllable bootstrap circuit by using the first switch unit and charge the first capacitor and second capacitor, and it simply needs an auxiliary power supply (i.e., power supply). The gate driver circuit in this embodiment has the advantages of monolithic integration, strong universality, controllable bootstrap circuit, accurate adjustment of positive and negative power supplies, high system reliability, easy implementation in hardware and flexibility in multiphase.

Figure 3:
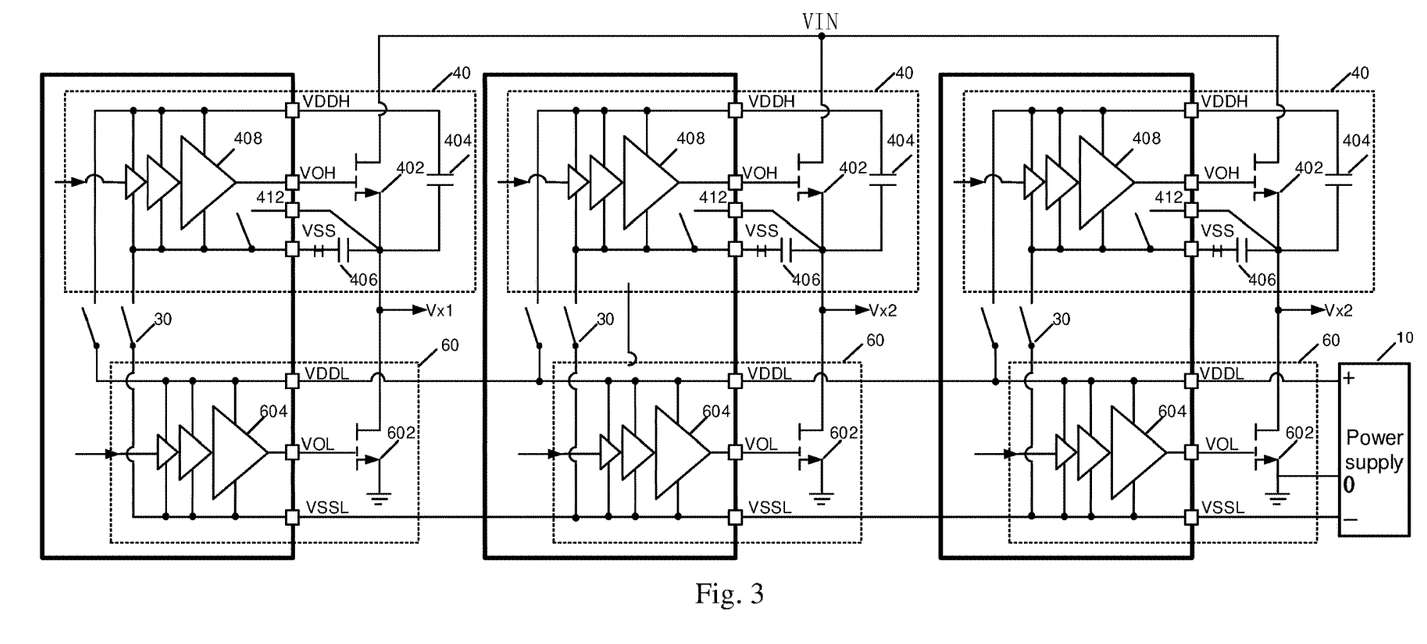
FIG. 3 is a schematic circuit diagram of a multiphase intelligent power module according to an embodiment.

In an embodiment, a multiphase intelligent power module includes a power supply 10, at least two first drive units 40, and a second drive unit 60 corresponding to each first drive unit 40;

the first switch unit 30 is connected in series with a first capacitor 404 and a second capacitor 406; and when the first switch unit 30 is closed, the power supply is used for charging the first capacitor 404 and the second capacitor 406;

the first drive unit 40 includes a first buffer 408, a first power transistor 402, a first capacitor 404 and a second capacity 406; and an output end of the first buffer 408 is connected with the gate of the first power transistor 402;

the first capacitor 404 is configured to increase the gate voltage of the first power transistor 402 when the first buffer 408 drives the first power transistor 402 to an on state, so that the first power transistor 402 is turned on;

the second capacitor 406 is configured to provide a negative turn-off voltage for the first power transistor 402 when the first buffer 408 drives the first power transistor 402 to an off state, so that the first power transistor 402 is turned off; and the second drive unit 60 includes a second buffer 604 and a second power transistor 602; and an output end of the second buffer 604 is connected with the gate of the second power transistor 602; and a high-voltage end of the second buffer 604 is connected with the positive electrode of the power supply; the source of the second power transistor 602 is connected with a ground; the source of the first power transistor 402 is connected with the drain of the second power transistor 602.

As shown in FIG. 3, a schematic circuit diagram of a multiphase intelligent power module according to an embodiment. It includes three first drive units 40 and a second drive unit 60 corresponding to each first drive unit 40. The drain of each first power transistor is connected to a same VIN end. It can be understood that the drain of each first power transistor may correspond to a VIN end. When the first switch unit 30 of each first drive unit 40 is closed, the power supply 10 charges the first capacitor 404 and second capacitor 406 of each first drive unit 40. After being charged, the first capacitor 404 is used to provide the gate voltage of the first power transistor 402 when the first buffer 408 drives the first power transistor 402 to an on state, so that the first power transistor 402 is turned on. After being charged, the second capacitor 406 is used to provide a negative turn-off voltage for the first power transistor 402 when the first buffer 408 drives the first power transistor 402 to an off state, so that the first power transistor 402 is turned off.

The second drive unit 60 includes a second power transistor 602 and a second buffer 604. The output end of the second buffer 604 is connected to the gate of the second power transistor 602. The high-voltage end of the second buffer 604 is connected to the positive electrode of the power supply 10, and the source of the second power transistor 602 is connected to a ground. Then the second buffer 604 can control on/off of the second power transistor 602. The first power transistor 402 and second power transistor 602 are alternately turned on when the source of the first power transistor 402 is connected to the drain of the second power transistor 602. Therefore, the potential between the first power transistor 402 and the second power transistor 602 changes accordingly, and alternate current of high potential is generated. In this embodiment, a plurality of first capacitor and second capacitor can be charged simply with one power supply module, so that the gate voltage of the field effect transistor is increased, the gate drive is realized at a lower cost, and the voltage of the first power transistor is stabilized.

In an embodiment, the negative electrode of the power supply 10 is used to connect with the low-voltage end of the second buffer 604; when the second buffer 604 drives the second power transistor 602 to an off state, the negative electrode of the power supply 10 is used to provide a negative turn-off voltage for the second power transistor 602.

In this embodiment, the negative electrode of the power supply 10 is used to connect with the low-voltage end of the second buffer 604. When the second buffer 604 drives the second power transistor 602 to an off state, the negative electrode of the power supply 10 is used to provide a negative turn-off voltage for the second power transistor 602, which can adaptively convert the external voltage into a voltage capable of driving the power transistor, thereby the second power transistor 602 is adaptively turned off, and the circuit is easy to realize.

In an embodiment, the circuit further includes a controller 50 for controlling on/off of the first switch unit 30, so as to control the charging time of the first capacitor 404 and the second capacitor 406. The controller 50 is further used to alternately output control signals to the first buffer 408 and the second buffer 604, so that the first buffer 408 provides a gate voltage for the first power transistor 402, and the second buffer 604 provides a gate voltage for the second power transistor 602. A control signal output by the controller 50 is capable of changing the potential between the first power transistor 402 and the second power transistor 602 to generate alternate current.

In an embodiment, the circuit also includes a level shifter 410. The level shifter 410 has its input end connected to the controller 50, and its output end connected to the input end of the first buffer 408. In this embodiment, the level shifter 410 can be used to increase the input voltage of the first buffer 408 to realize the gate driver function.

In an embodiment, the first power transistor 402 includes a wide-bandgap FET (Field Effect Transistor), an IGBT (Insulated Gate Bipolar Transistor) or a MOSFET (Metal Oxide Semiconductor Field Effect Transistor). The wide-bandgap FET may be SiC FET or GaN FET.

In an embodiment, the gate driver circuit further includes a second switch unit 412, which is used to short-circuit the gate of the first power transistor 402 and the source of the first power transistor 402, the first power transistor 402 is turned off.

Figure 4:
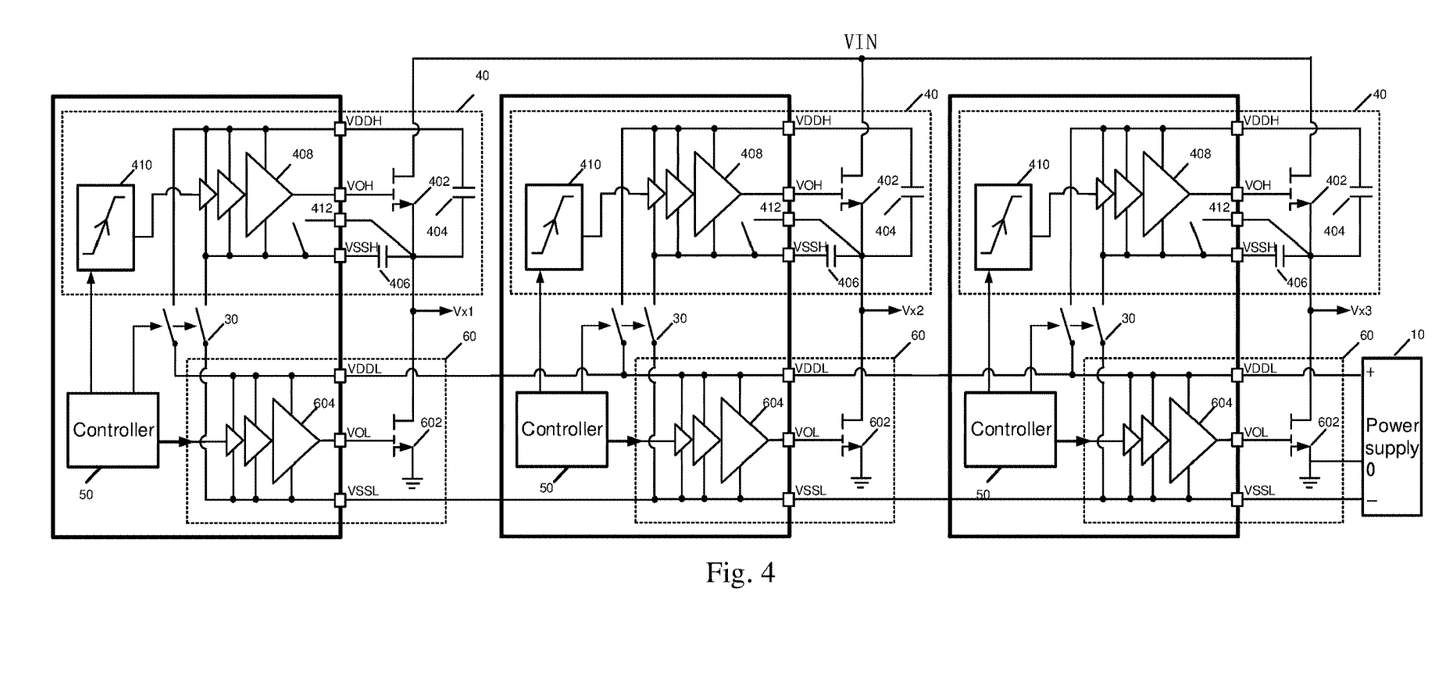
FIG. 4 is a schematic diagram of a three-phase power driver circuit according to an embodiment.

In an embodiment, as shown in FIG. 4, a schematic circuit diagram of a multiphase intelligent power module according to an embodiment. The three solid blocks in the diagram represent three integrated chips, in which controller 50, level shifter 410, first switch unit 30, first buffer 408 and second buffer 604 are integrated in each chip. The controller 50 may be used to control the first switch unit 30. The controller 50 receives electrical signal output by the second power supply 20, and transmits the electrical signal to the first buffer 408 via the level shifter 410 when the first power transistor 402 needs to be driven. When the second power transistor 602 needs to be driven, the electrical signal is input to the second buffer 604. The internal structure of the chip and the external circuits have been described in the embodiments and shown in FIGS. 2-3, and thus, repeated descriptions are not included. In FIG. 4, the second power supply 20 can simultaneously provide a positive voltage for the high-voltage end VDDL and a negative voltage for the low-voltage end VSSL of the second drive unit 60 in the three chips, so that the power supply of the three-phase power driver circuit can be shared among all phases, and the circuit has a high degree of integration.

The above are only preferred embodiments of the present application, which do not limit the patent scope of the present application. Any equivalent transforms of the structure or procedures made by using the contents of the specification and drawings of the present application, or directly or indirectly applied to other related technical fields, are intended to be included in the protection scope of the present application.

What is claimed is:

1. A gate driver circuit, comprising a power supply, a first switch unit, a first drive unit and a second drive unit;
   the first switch unit is connected in series with a first capacitor and a second capacitor; and when the first switch unit is closed, the power supply is used for charging the first capacitor and the second capacitor;
   the first drive unit comprises a first buffer, a first power transistor, the first capacitor and the second capacity; and an output end of the first buffer is connected with the gate of the first power transistor;
   the first capacitor is configured to increase the gate voltage of the first power transistor when the first buffer drives the first power transistor to an on state, so that the first power transistor is turned on;
   the second capacitor is configured to provide a negative turn-off voltage for the first power transistor when the first buffer drives the first power transistor to an off state, so that the first power transistor is turned off;
   the second drive unit comprises a second buffer and a second power transistor; and an output end of the second buffer is connected with the gate of the second power transistor; and a high-voltage end of the second buffer is connected with the positive electrode of the power supply; the source of the second power transistor is connected with a ground; and the source of the first power transistor is connected with the drain of the second power transistor and
   the gate driver circuit further comprises a controller for controlling the opening and closing of the first switch unit.

2. The circuit of claim 1, wherein the negative electrode of the power supply is used for connecting with a low-voltage end of the second buffer; when the second buffer drives the second power transistor to an off state, the negative electrode of the power supply is used to provide a negative turn-off voltage for the second power transistor.

3. The circuit of claim 1, further comprising a level shifter, wherein an input end of the level shifter is connected with the controller, and an output end of the level shifter is connected with an input end of the first buffer.

4. The circuit of claim 1, wherein the first power transistor comprises a wide-bandgap field effect transistor, an IGBT or a MOSFET.

5. The circuit of claim 3, wherein the controller, the level shifter, the first buffer and the second buffer are integrated in a chip.

6. The circuit of claim 1, further comprising a second switch unit, and the second switch unit is used for short-circuiting the gate of the first power transistor with the source of the first power transistor to turn off the first power transistor.

7. A multiphase intelligent power module, comprising a power supply, a first switch unit, at least two first drive units, and a second drive unit corresponding to each first drive unit;
   the first switch unit is connected in series with a first capacitor and a second capacitor; and when the first switch unit is closed, the power supply is used for charging the first capacitor and the second capacitor;
   the first drive unit comprises a first buffer, a first power transistor, the first capacitor and the second capacity; and an output end of the first buffer is connected with the gate of the first power transistor;
   the first capacitor is configured to increase the gate voltage of the first power transistor when the first buffer drives the first power transistor to an on state, so that the first power transistor is turned on;
   the second capacitor is configured to provide a negative turn-off voltage for the first power transistor when the first buffer drives the first power transistor to an off state, so that the first power transistor is turned off;
   the second drive unit comprises a second buffer and a second power transistor; and an output end of the second buffer is connected with the gate of the second power transistor; and a high-voltage end of the second buffer is connected with the positive electrode of the power supply; the source of the second power transistor is connected with a ground; and the source of the first power transistor is connected with the drain of the second power transistor and the multiphase intelligent power module further comprises a controller for controlling the opening and closing of the first switch unit.

8. The module of claim 7, wherein the negative electrode of the power supply is used for connecting with a low-voltage end of the second buffer; when the second buffer drives the second power transistor to an off state, the negative electrode of the power supply is used to provide a negative turn-off voltage for the second power transistor.

9. The module of claim 7, further comprising a level shifter, wherein an input end of the level shifter is connected with the controller, and an output end of the level shifter is connected with an input end of the first buffer.

10. The module of claim 7, wherein the first power transistor comprises a wide-bandgap field effect transistor, an IGBT or a MOSFET.

11. The module of claim 7, wherein the first drive unit further comprises a second switch unit, and the second switch unit is used for short-circuiting the gate of the first power transistor with the source of the first power transistor to turn off the first power transistor.

* * * * *